United States Patent
Niitsu et al.

(10) Patent No.: US 9,004,925 B2
(45) Date of Patent: Apr. 14, 2015

(54) CAPACITIVELY COUPLED CONNECTOR USING LIQUID DIELECTRIC FOR IMPROVED PERFORMANCE

(75) Inventors: Toshihiro Niitsu, Machida (JP); Masako Nishikawa, Yamato (JP)

(73) Assignee: Molex Incorporated, Lisle, IL (US)

( * ) Notice: Subject to any disclaimer, the term of this patent is extended or adjusted under 35 U.S.C. 154(b) by 430 days.

(21) Appl. No.: 13/146,477

(22) PCT Filed: Feb. 1, 2010

(86) PCT No.: PCT/US2010/022694
§ 371 (c)(1),
(2), (4) Date: Jul. 27, 2011

(87) PCT Pub. No.: WO2010/088582
PCT Pub. Date: Aug. 5, 2010

(65) Prior Publication Data
US 2011/0279946 A1 Nov. 17, 2011

(30) Foreign Application Priority Data

Jan. 30, 2009 (JP) .................................. 2009-019765

(51) Int. Cl.
*H01R 12/00* (2006.01)
*H05K 3/36* (2006.01)
*H05K 1/02* (2006.01)

(52) U.S. Cl.
CPC .............. *H05K 3/361* (2013.01); *H05K 1/0239* (2013.01); *H05K 2201/0187* (2013.01); *H05K 2203/0759* (2013.01); *H05K 2203/1147* (2013.01); *Y10S 439/95* (2013.01)

(58) Field of Classification Search
CPC ....................................................... H05K 3/365
USPC ............................................. 439/67, 38, 950
See application file for complete search history.

(56) References Cited

U.S. PATENT DOCUMENTS

T889,010 I4 * 8/1971 Tapley .......................... 361/319
3,611,225 A 10/1971 Dakin
(Continued)

FOREIGN PATENT DOCUMENTS

CN 1805656 A 7/2006
JP 2002-289309 * 10/2002
(Continued)

OTHER PUBLICATIONS

International Search Report for PCT/US2010/022694, Dec. 2010.

*Primary Examiner* — Neil Abrams
(74) *Attorney, Agent, or Firm* — Timothy M. Morella

(57) ABSTRACT

A connector assembly utilizes improved capacitive coupling for connecting together electrical circuits on two substrates (7, 8). The connector assembly includes first (2) and second (3) connectors respectively attached to first and second circuit substrates. The first connector includes a plurality of first conductors (25) connected to circuits (75) on the first circuit substrate and these conductors have exposed contact surfaces with a dielectric material (4) disposed thereon. The first conductors and associated dielectric material confront second, opposing conductors (35) supported by the second connector frame when the connector frames are engaged together. A liquid dielectric material (45) is interposed between the terminals and the dielectric portions that fills minute gaps which may occur in the dielectric portions to improve the capacitive coupling ability of the connector assembly.

21 Claims, 8 Drawing Sheets

(56) References Cited

U.S. PATENT DOCUMENTS

| | | | |
|---|---|---|---|
| 4,117,579 A | * | 10/1978 | Shaw et al. ............... 29/25.42 |
| 4,144,485 A | | 3/1979 | Akita |
| 4,647,126 A | | 3/1987 | Sobota |
| 4,674,010 A | | 6/1987 | van den Steen |
| 4,716,058 A | | 12/1987 | Morin |
| 4,770,641 A | | 9/1988 | Rowlette |
| 5,037,312 A | | 8/1991 | Casciotti et al. |
| 5,074,799 A | | 12/1991 | Rowlette, Sr. |
| 5,298,288 A | | 3/1994 | Curry, II et al. |
| 5,403,202 A | | 4/1995 | Roehling |
| 5,432,486 A | | 7/1995 | Wong |
| 5,574,273 A | | 11/1996 | Nakagawa et al. |
| 5,769,647 A | | 6/1998 | Tulley et al. |
| 5,791,943 A | | 8/1998 | Lo et al. |
| 5,921,787 A | | 7/1999 | Pope et al. |
| 5,936,841 A | | 8/1999 | Kantner et al. |
| 6,007,359 A | | 12/1999 | Kosmala |
| 6,162,083 A | | 12/2000 | Seto |
| 6,317,011 B1 | | 11/2001 | Barnett et al. |
| 6,533,586 B2 | * | 3/2003 | Marketkar et al. ............... 439/38 |
| 6,575,769 B1 | | 6/2003 | Takeuchi et al. |
| 6,612,852 B1 | | 9/2003 | Panella |
| 6,657,866 B2 | | 12/2003 | Morelock |
| 6,733,325 B2 | | 5/2004 | Sakai et al. |
| 6,806,542 B1 | * | 10/2004 | Zhang et al. ............... 257/411 |
| 6,813,163 B2 | | 11/2004 | Inoue et al. |
| 6,836,016 B2 | | 12/2004 | Marketkar et al. |
| 7,064,626 B2 | | 6/2006 | Kukita et al. |
| 7,112,069 B2 | | 9/2006 | Sandoval et al. |
| 7,134,882 B2 | | 11/2006 | Iida et al. |
| 7,252,565 B2 | | 8/2007 | Hunter |
| 7,320,606 B2 | | 1/2008 | Midorikawa |
| 7,367,812 B2 | | 5/2008 | Shih et al. |
| 7,377,804 B2 | | 5/2008 | Lin |
| 7,511,523 B2 | | 3/2009 | Chen et al. |
| 7,530,839 B1 | | 5/2009 | Lee |
| 7,556,504 B2 | | 7/2009 | Ryu |
| 7,618,282 B2 | | 11/2009 | Wu et al. |
| 7,682,159 B2 | | 3/2010 | Huang et al. |
| RE41,473 E | | 8/2010 | Hirata et al. |
| 7,811,135 B2 | | 10/2010 | Idzik et al. |
| 8,157,598 B2 | * | 4/2012 | Niitsu ............... 439/660 |
| 8,197,286 B2 | | 6/2012 | Larsen et al. |
| 8,287,289 B2 | * | 10/2012 | Niitsu et al. ............... 439/66 |
| 8,371,862 B2 | * | 2/2013 | Niitsu et al. ............... 439/74 |
| 8,475,181 B2 | | 7/2013 | Niitsu et al. |
| 8,708,714 B2 | | 4/2014 | Niitsu |
| 2001/0024888 A1 | | 9/2001 | Marketkar et al. |
| 2001/0041465 A1 | | 11/2001 | Szalay et al. |
| 2002/0196614 A1 | | 12/2002 | DiBene, II et al. |
| 2004/0080921 A1 | | 4/2004 | Paola |
| 2005/0009383 A1 | | 1/2005 | Okura et al. |
| 2005/0101164 A1 | | 5/2005 | Rathburn |
| 2005/0176301 A1 | | 8/2005 | Barr |
| 2005/0206603 A1 | | 9/2005 | Kawachi et al. |
| 2006/0022336 A1 | | 2/2006 | Franzon et al. |
| 2006/0183358 A1 | | 8/2006 | Iida et al. |
| 2007/0023921 A1 | | 2/2007 | Zingher et al. |
| 2007/0080468 A1 | | 4/2007 | Kamiya |
| 2007/0264854 A1 | | 11/2007 | Sasaki |
| 2007/0281519 A1 | | 12/2007 | Shiroyama |
| 2008/0057748 A1 | | 3/2008 | Nakata et al. |
| 2012/0003851 A1 | * | 1/2012 | Nishikawa et al. ............... 439/78 |

FOREIGN PATENT DOCUMENTS

| | | |
|---|---|---|
| JP | 2004-308161 | 5/2006 |
| JP | 2006-120511 | 5/2006 |
| JP | 2007-105155 | 10/2008 |
| JP | 2008-262828 | 10/2008 |
| WO | WO 2009/134792 A1 | 11/2009 |

\* cited by examiner

CAPACITIVELY COUPLED CONNECTOR USING LIQUID DIELECTRIC FOR IMPROVED PERFORMANCE

REFERENCE TO RELATED APPLICATIONS

The Present Application claims priority of Japanese Patent Application No. 2009-019765, entitled "Connector Using Liquid Dielectric For Improved Performance," and filed 30 Jan. 2009, the contents of which is fully incorporated in its entirety herein.

BACKGROUND OF THE PRESENT APPLICATION

The Present Application relates to a connector and method that improves performance of capacitively coupled connectors. Conventionally, there is known a connector in which a terminal held in one housing and a terminal held in another housing are arranged spatially apart from each other, as a connector for realizing the capacity-coupling between terminals. An example of such a connector is shown in Japanese Patent Application No. 2002-289309, in which a dielectric portion is arranged between two sets of opposing terminals.

Although such a connector is capable of transmitting electrical signals, it has been discovered that the application of a dielectric material to the terminals is not always done perfectly. That is, there remains often surface roughness in the form of asperities, which prevents close and intimate surface to surface contact. The surface roughness leads to minute, on the level of microscopic scale gaps between the dielectric material and its opposing terminal or conductor. Air can enter these gaps and affect the capacitance that occurs between the two terminals of the connector assembly. The air deleteriously interposes itself between the terminals and the dielectric material, thereby deteriorating the capacitance between the terminals.

Further, a large number of minute asperities exist on surfaces of the terminals and the dielectric material making those surfaces rough so that it is difficult to obtain close, intimate face-to-face contact between the terminals and the dielectric material. Hence, a large number of minute gaps are microscopically formed therebetween, even when the terminals and the dielectric are contacted with each other and air may enter these gaps. Therefore, there is a realized concern that the capacitance between the terminals deteriorates by the presence of air in these gaps.

The Present Application provides a solution to this problem and an advantage over known connectors that utilize capacitive coupling for signal transmission.

SUMMARY OF THE PRESENT APPLICATION

Accordingly, it is an object of the Present Application to provide a connector and a connecting method that reduces the deterioration in capacitance that can occur between capacitively coupled terminals.

In order to solve the above-mentioned problems, a connector for electrical circuits according to the Present Application includes one or more first conductors electrically connected to electrical circuits of a first flat circuit substrate; first dielectric portions provided on contact surfaces of each of the first conductors; and one or more opposing, second conductors provided on a second flat circuit substrate, characterized in that the first and second conductors are opposed to each other with the dielectric portions interposed therebetween and a second dielectric material, a liquid dielectric material is interposed between the dielectric portions and the opposing second conductors in order to fill any minute gaps that may occur on the opposing surfaces of the first dielectric portions and the second, opposing conductors.

Further, a method for connecting electrical circuits together via capacitive coupling with improved signal transmission, according to the Present Application is characterized by the steps of: 1) providing first dielectric portions on one or more first conductors of a first connector which is electrically connected to electrical circuits of a first circuit substrate; 2) positioned second conductors of a second connector or a second flat circuit substrate in opposition to the first conductors; 3) providing a second dielectric material in the form of a liquid and applying it to either of the first dielectric portions or the second conductors; and 4) mating the two connectors together so that the liquid dielectric material is interposed between the first dielectric material and the second conductors and fills any minute gaps that may occur between the first dielectric material and the opposing second conductors.

According to the Present Application, the liquid dielectric material is a second dielectric material that is interposed between the first dielectric portion and the opposing second conductor to fill any gaps that occur therebetween, and hence reduce the deterioration in the capacitance that may occur due to minute gaps between the opposing surfaces of the two connectors. Further, the liquid dielectric material is used, and hence short circuit can be suppressed even when a plurality of opposing second conductors are present.

Further, in one aspect, the first dielectric portions are held in contact with the opposing portions, and the liquid dielectric material is interposed in the gaps between the dielectric portions and the opposing portions. According to this aspect, because the liquid dielectric material is used, the dielectric portion and the opposing portion can be held in contact with each other. As a result, the distance between the dielectric portion and the opposing conductor is shortened, as is the overall height of the connector assembly.

Further, in another aspect, the first conductors may take the form of contact pads disposed on a surface of the first circuit substrate. Similarly, the opposing second conductors may also be formed on the second circuit substrate so that the vertical distance, or height between the first circuit substrate and the second circuit substrate is reduced.

In yet another aspect, the first conductors are formed as plates or in a plate-like shape with two opposite facing contact surfaces. One contact surface of each first conductor is connected to an electrical circuit, and the other contact surface has the first dielectric portion applied thereto. With this construction, a space is provided between the first and the second circuit substrates, and hence a component for coupling the first and second circuit substrates can be arranged therebetween.

In still another aspect, the opposing second conductors are also formed as plates or with plate-like shapes, and they each include two contact surfaces, with one of the contact surfaces connected to the electrical circuits of the second circuit substrate, and the other contact surface that opposes the first dielectric portion. The other contact surface is held in contact with the first dielectric portion by way of a second dielectric material in the form of a liquid. With this construction, a space is ensured between the first and the second circuit substrates, and hence the component for coupling the first and second circuit substrates can be disposed therebetween.

Furthermore, in an aspect of the Present Application, the liquid dielectric material has a gel-like consistency and a relatively high dielectric constant and a viscosity that permits its application to the connector, yet retards any significant offflow of it from the connector. Preferably the liquid dielectric material is a glycol-based resin such as polypropylene glycol (PPG) and it may include other materials such as petroleum jelly, acrylic resin and silicone oil.

These objects, aspects and advantages will be apparent through a reading of the following detailed description.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the embodiments illustrated in the Figures, representations of directions such as up, down, left, right, front, rear and the like, used for explaining the structure and movement of the various elements of the Present Application, are not absolute, but relative. These representations are appropriate when the elements are in the position shown in the Figures. If the description of the position of the elements changes, however, it is assumed that these representations are to be changed accordingly.

Figure 1:
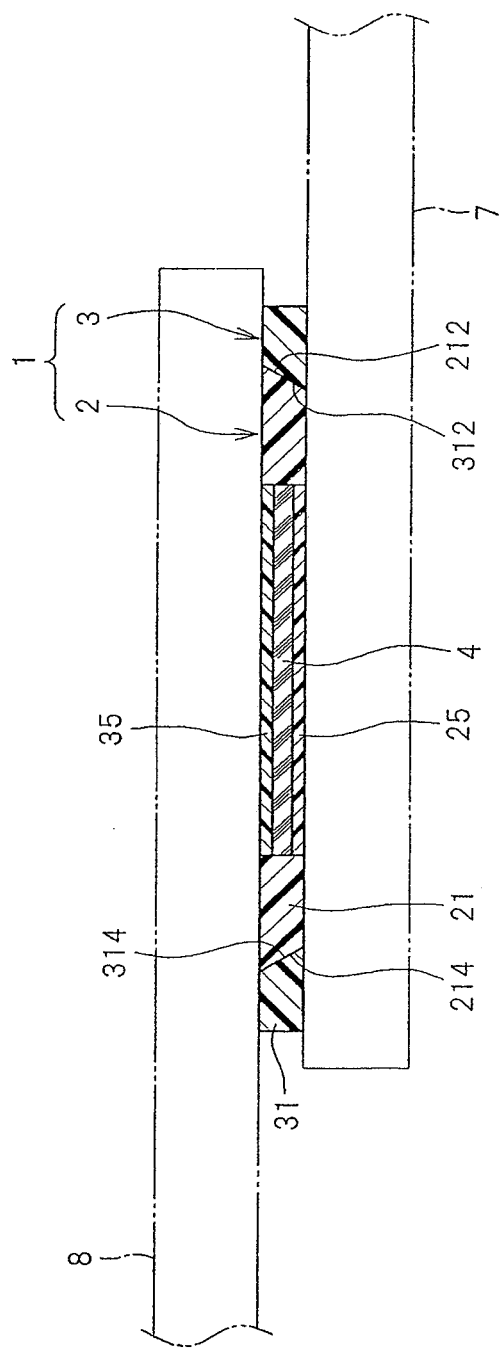
FIG. 1 is a sectional view of a connector assembly of the Present Application.

FIG. 1 is a sectional view of a connector assembly that finds utility in connecting together a first circuit substrate 7 and a second circuit substrate 8. The substrates 7, 8 may be flexible printed circuitry (FPC) or a printed wiring board, and respectively have a male connector 2 and a female connector 3 attached to the first and second circuit substrates 7, 8.

The male connector 2 has a first connector frame 21, and terminals 25 in the form of plates which serve as conductor portions of the connector 2. The terminals 25 are arranged in the first connector frame 21 in side by side order with open spaces separating adjacent terminals. Film-like dielectric portions or layers 4 are arranged on the contact surfaces of the terminals 25 that face the second connector frame 31 (upwardly). In contrast, the female connector 3 has a second connector frame 31, and plate-like terminals 35 serving as opposing portions are arranged in the second connector frame 31. Preferably the terminals 25 and 35 of the two connector frames are sized equally and the second connector frame terminals 31 also have flat contact surfaces within the second connector frame that face the first connector frame 21 (downwardly). Both connector frames 21, 31 are generally flat with a low profile.

When the first and the second connector frames 21, 31 are mated together, their respective terminals 25, 35 oppose each other. No direct metal to metal contact is made between the terminals 25, 35 because there are nonconductive, dielectric portions (layers) 4 which are interposed therebetween. As a result, capacitive-coupling between the opposing terminals 25, 35 is realized, which performs well to transmit high-frequency electrical signals between the circuits on the first and second circuit substrates.

The male connector 2 has a first connector frame 21 made of a resin and formed into a ladder-like shape, with a terminal holder 23 provided with a plurality of conductive terminals 25, and dielectric portions 4 provided on at least the contact surfaces of the respective terminals 25.

The first connector frame 21 is generally rectangular with a frame portion 216 formed from two pairs of opposing, and preferably parallel sides. The first connector frame 21 includes a plurality of beam portions 217 that extend transversely between the sides of the first connector frame 21 and within the frame portion 216. Open spaces 218 are disposed alongside and between adjacent beam portions 217 and the end side members of the frame serve to separate, or isolate them from each other. The outer edges of the long sides of the frame portion 216 may have tapered portions 212, 214, respectively, which protrude on a top surface 21a side thereof outward with respect to a bottom surface 21b side thereof. The terminal holder 23 is attached on the bottom surface 21b side of the frame portion 216. The positions of the hole portions 218 correspond to the positions of the terminals 25, and the dielectric portions 4 are accommodated in the respective open spaces 218.

The terminal holder 23 has a plate-like base member 232 made of an insulative resin and conductors that may take the form of films 252 wound around the plate-like base member 232, in a manner such that the conductor films 252 form the terminals 25. In one specific example, a nickel undercoat with a gold plating may be applied to the base member 232 which is formed from a bismaleimide-triazine (BT, and copper foils are used as the conductor films 252. The terminal holder 23 may also be formed by molding a metal plate to serve as the terminal 25 directly into the base member 232, such as by insert molding. Other means of manufacturing the terminals and base member may be used.

The dielectric portions 4 are made of a high dielectric material and preferably a ceramic one, such as tantalum pentoxide and/or barium titanate, and this material is bonded to top surfaces 25a of the terminals 25. In a specific example, copper layers are formed on the bottom surfaces of the dielectric portions 4 by evaporation or the like, and the copper layers are bonded to the top surfaces 25a of the terminals 25 by soldering or the like. With this construction, air layers are suppressed from being formed between the terminals 25 and the dielectric portions 4. Note that the dielectric portions 4 may be formed on the terminals 25 by sputtering or printing.

Figure 2A:
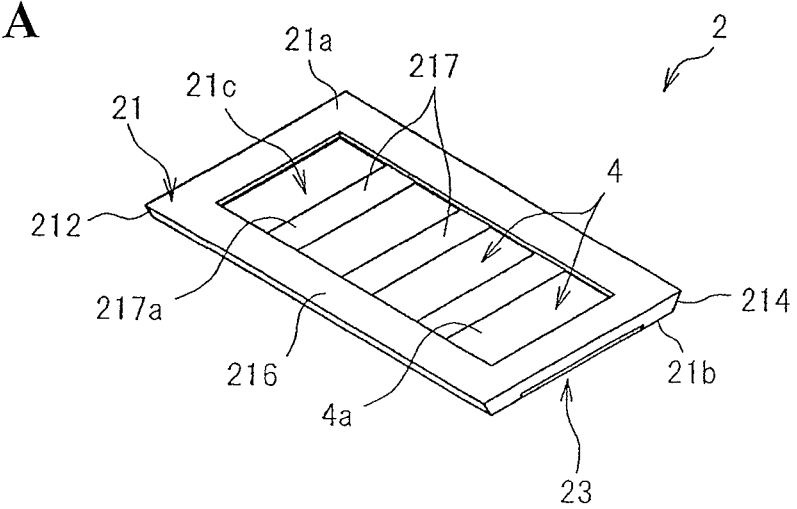
FIG. 2A is a perspective view of a first, or male connector, used in the connector assembly of FIG. 1.
Figure 2B:
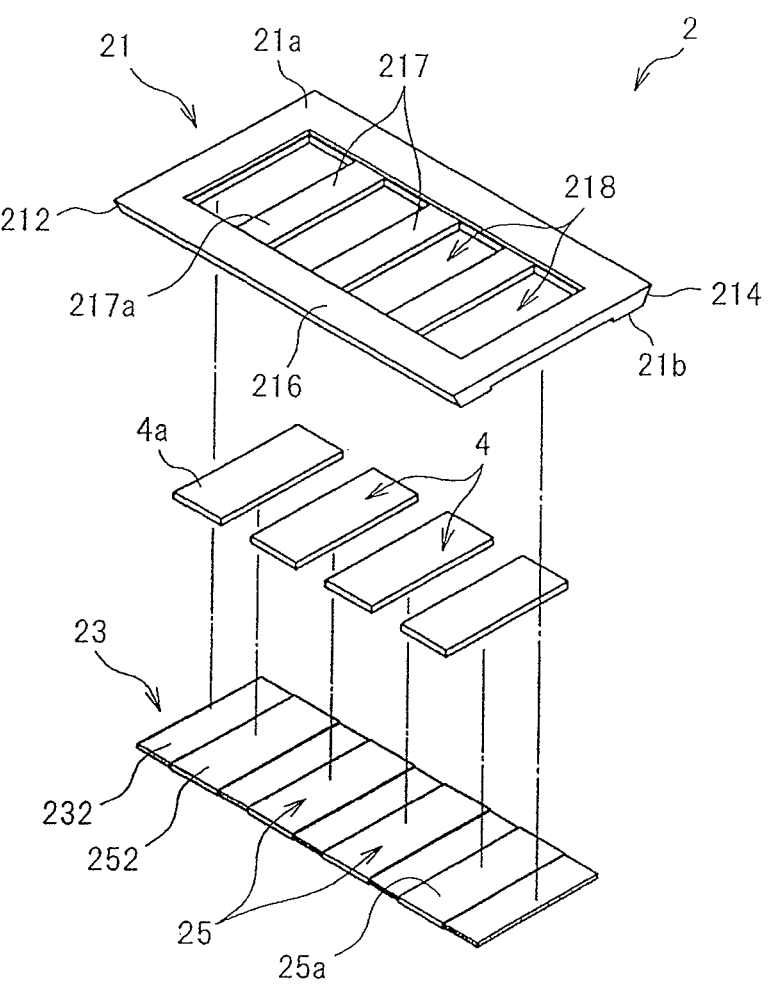
FIG. 2B is an exploded perspective view of the male connector of FIG. 2A.
Figure 3:
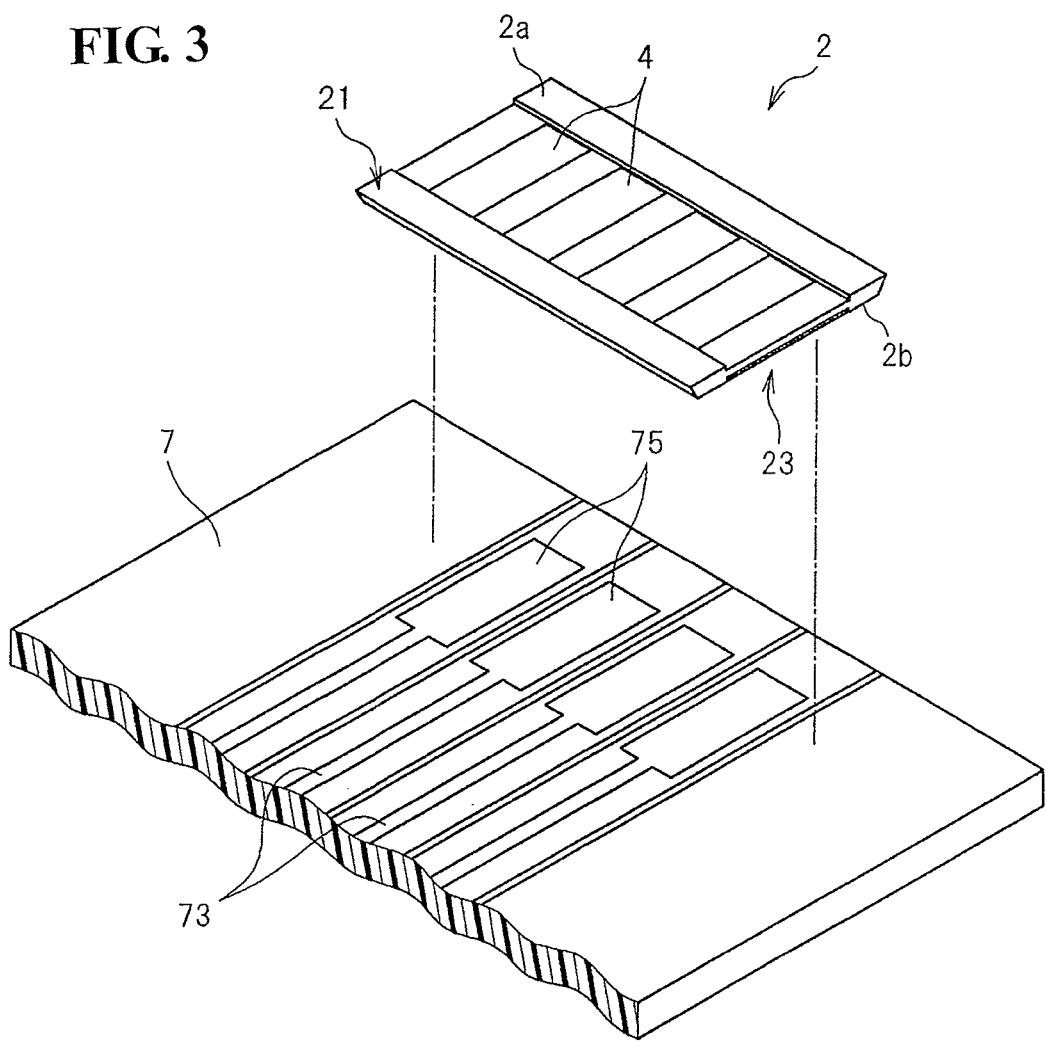
FIG. 3 is a perspective view illustrating how the male connector of FIG. 2A is mounted to a first circuit substrate.

FIG. 3 is a view illustrating how the male connector 2 is mounted to the first circuit substrate 7 which has a plurality of electrical circuits 73, and contact pads 75 are formed at end portions of the circuits 73. Each contact pad 75 is an exposed conductor present on the first circuit substrate 7, that is, a conductor pattern for connection. The bottom surface 21$b$ of the first connector frame 21 is bonded to the top surface of the first circuit substrate 7, and the bottom surfaces 25$b$ (see FIG. 2D) of the terminals 25 are connected to the contact pads 75 exposed on the first circuit substrate 7.

Figure 4A:
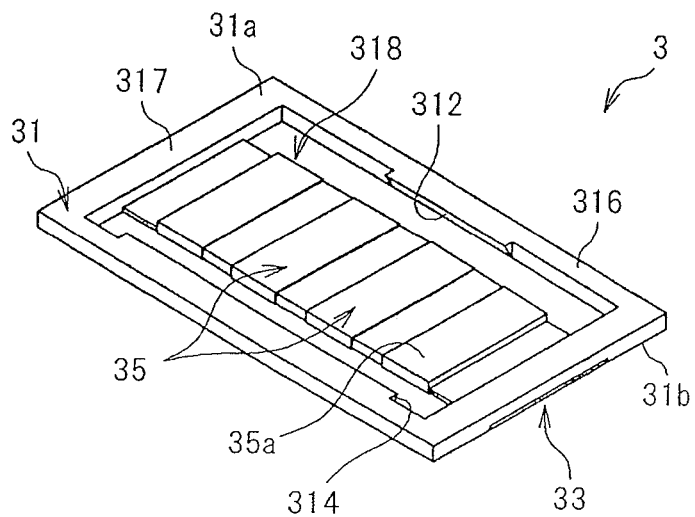
FIG. 4A is a perspective view of a second, or female, connector of the connector assembly of FIG. 1.
Figure 4B:
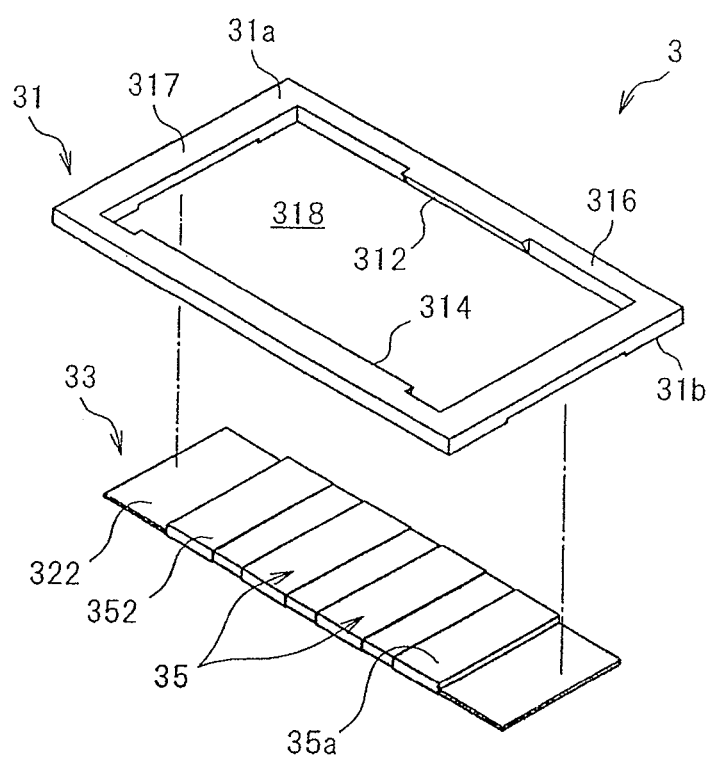
FIG. 4B is an exploded view of the female connector of FIG. 4A.

FIGS. 4A and 4B are a perspective view and an exploded perspective view of the female connector 3, respectively. The female connector 3 also has a rectangular second connector frame 31 having an adequate elasticity and made of an insulative resin, and a terminal holder 33 provided with the plurality of conductive terminals 35.

The second connector frame 31 has a pair of long side portions 316 and a pair of short side portions 317, and those side portions cooperatively surround a hole portion 318. The first connector frame 21 is fitted into this hole portion 318. The terminal holder 33 is attached on a bottom surface 31$b$ side of the second connector frame 31. Further, at inner edges of the long side portions 316, there are respectively formed tapered portions 312, 314 extending inwards on a top surface 31$a$ side with respect to the back surface 31$b$ side.

Similarly to the above-mentioned terminal holder 23, the second connector terminal holder 33 also has a plate-like base member 332 made of a resin and may include conductor films 352 formed so as to be wound therearound, so that the conductor films 352 constituting the terminals 35. Note that, of the plate-like base member 332 and the conductor films 352, portions corresponding to the inner side of the recessed portion 21$c$ of the first connector frame 21 are formed to be somewhat thicker than other portions toward the top surface 31$a$ side.

Figure 5:
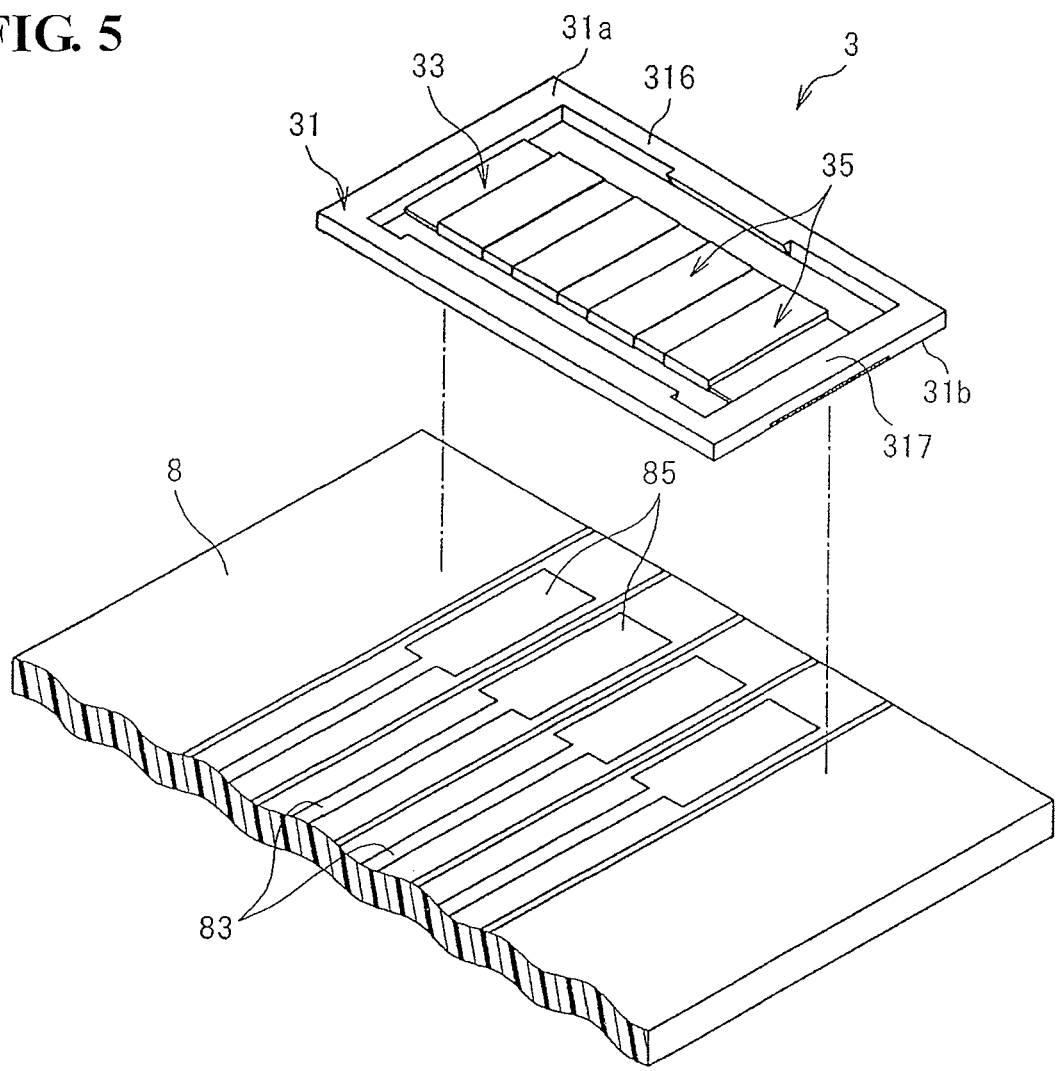
FIG. 5 is a perspective view illustrating how the female connector of FIG. 4A is mounted to a second circuit substrate.

FIG. 5 is a view illustrating how the female connector 3 is mounted to its respective second circuit substrate. Similarly to the above-mentioned first circuit substrate 7, the second circuit substrate 8 on which the female connector 3 is mounted has a plurality of electrical circuits 83, and contact pads 85 are typically formed at end portions of the electrical circuits 83. Each contact pad 85 is an exposed conductor pattern formed on the second circuit substrate 8, that is, a conductor pattern for connection. The bottom surface 31$b$ of the second connector frame 31 of the female connector 3 is bonded to the top surface of the second circuit substrate 8, and the bottom surfaces of the terminals 35 are connected to the conductor pads 85 provided on the second circuit substrate 8.

Note that, in order to allow elastic deformation of the long side portions 316 of the second connector frame 31, it is preferable that, of the bottom surface 31$b$ of the second connector frame 31, only the bottom surfaces of the short side portions 317 be bonded to the top surface of the second circuit substrate 8, and that the bottom surfaces of the long side portions 316 are not bonded to the top surface of the second circuit substrate 8.

The first connector frame 21 of the male connector 2 and the second connector frame 31 of the female connector 3, which are described above, are fitted together as illustrated above in FIG. 1. In this case, the terminals 35 of the female connector 3 are inserted into the recessed portion 21$c$ formed on the front surface side of the first connector frame 21, and brought into contact with the dielectric portions 4 on the terminals 25 of the male connector 2. With this, the dielectric portions 4 are sandwiched between the terminals 25 and the terminals 35 opposed to each other.

Specifically, through fitting the tapered portions 212, 214 and the tapered portions 312, 314 together, the first connector frame 21 and the second connector frame 31 generate a mutual attracting force, whereby the dielectric portions 4 and the terminals 35 are brought into a reliable pressure contact with each other. Note that, the Present Application is not limited to such a mode, and may adopt a mode in which step-like members are fitted together.

Figure 6:
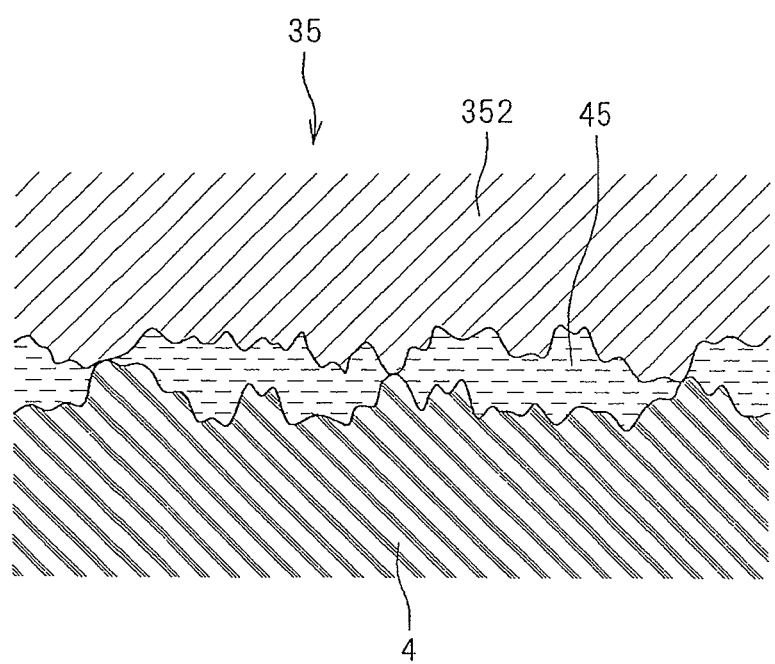
FIG. 6 is an enlarged detail view at a somewhat microscopic level, illustrating the contact which occurs between the dielectric portion disposed on one of the connector frames and an opposing, second conductor dispose don either the second connector frame or the second circuit substrate.

A liquid dielectric material 45 is applied to the bottom surface in the recessed portion 21$c$ of the first connector frame 21. Thus, as illustrated in FIG. 6, when the first connector frame 21 and the second connector frame 31 are fitted together, a liquid dielectric material 45 is interposed in minute gaps formed between the dielectric portions 4 and the terminals 35 (conductor films 352, specifically). The liquid dielectric material 45 is in a liquid state in a vicinity of room temperature, and has higher dielectric constant than that of air.

Specifically, as a main component of the liquid dielectric material 45, a glycol-based resin having relatively high dielectric constant is suitably used. Polypropylene glycol (PPG) of the Triol-type, M=1500, has been suitably used, This type of PPG has a viscosity of about substantially 200 to substantially 500 mPa·s (200 to 500 centipoise) at 25° C., which permits it to be applied to the selected positions of the connector or substrate and which does not easily stream away from the dielectric portions 4 or the terminals 35. This type of PPG has a dielectric constant of between about 5 and about 15. In actual testing, the use of PPG with dielectric constants from about 5 to about 15, at a minimum, doubled the capacitance normally obtained by contact only between the first dielectric and the opposing second conductors.

The main component of the liquid dielectric material 45 is not limited to a glycol-based resin. For example, silicone oil (dimethylsilicone), petrolatum (petroleum jelly), or an acrylic resin may be used. In particular, silicone oil has excellent heating resistance, and hence silicone oil is suitable in view of manufacturing under high temperature. These three liquid dielectric materials have dielectric constants that range from about 2 to about 5. Testing with silicone oil with a dielectric constant of about 2.75 resulted in capacitance increases ranging from about 13% to about 73% (as compared to a connector without the silicone oil); the use of petroleum jelly as a liquid dielectric material with a dielectric constant of about 2.2 resulted in a capacitance increase of between about 174%; and the use of acrylic resin resulted in a capacitance increase of about 287%. Thus it can be seen that a preferred range of dielectric constants for the liquid dielectric material ranges from about 2 to about 15, but it will be understood that there may be other values that are also suitable.

According to the embodiment of the Present Application described above, the liquid dielectric material 45 is interposed the dielectric portions 4 and the terminals 35, and fill the minute gaps which may occur due to surface roughness and the nature of the solid dielectric material and thereby eliminates air between the opposing terminals, or conductors 25, 35. Hence, deterioration of capacitance between the terminals 25 and the terminals 35 is suppressed. Further, by using the liquid dielectric material 45, it is possible to contact the dielectric portions 4 and the terminals 35 with each other, and to fill the minutes gaps between the dielectric portions 4 and the terminals 35. Further, as illustrated in FIG. 4A, by using the liquid dielectric material 45, any short circuit between the terminals 35 in the crosswise, planar direction is suppressed even when the plurality of terminals 35 are aligned in a plane.

Figure 7:
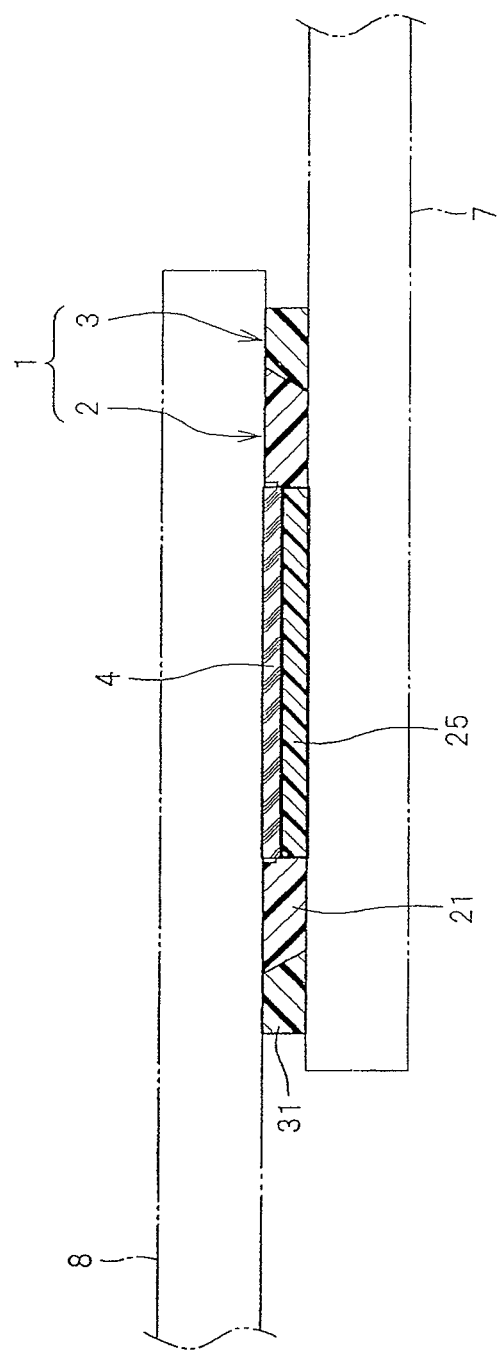
FIG. 7 is a sectional view of a connector assembly according to a modification of the Present Application.

Hereinbefore, while the embodiment of the Present Application is described, the Present Application is not limited to the above-mentioned embodiment. It is needless to say that various modifications can be made by those skilled in the art. For example, the solid dielectric portions 4 may be applied to the opposing second conductors of the second connector rather than the first conductors. Similarly, either the first or second connectors 2, 3 may include separate terminals as their respective conductors, or may include exposed conductive surface son the first and second circuit substrates 7, 8, and as such the term "conductors" as used herein is intended to cover conductors formed as terminals, coatings, layers, contact pads and the like For example, as illustrated in FIG. 7, the terminals 35 may be omitted from the above-mentioned construction illustrated in FIG. 1, and the dielectric portions 4 on the terminals 25 of the male connector 2 may be held in direct contact with the contact pads 85 (see FIG. 5) of the second circuit substrate 8, and the liquid dielectric material 45 may be interposed in gaps therebetween.

Further, for example, in the above-mentioned construction illustrated in FIG. 1, the dielectric portions may be provided also on the terminals 35, the dielectric portions 4 on the terminals 25 of the male connector 2 may come into contact with the dielectric portions on the terminals 35 of the female connector 3, and the liquid dielectric material may interpose in the gaps therebetween.

Figure 8:
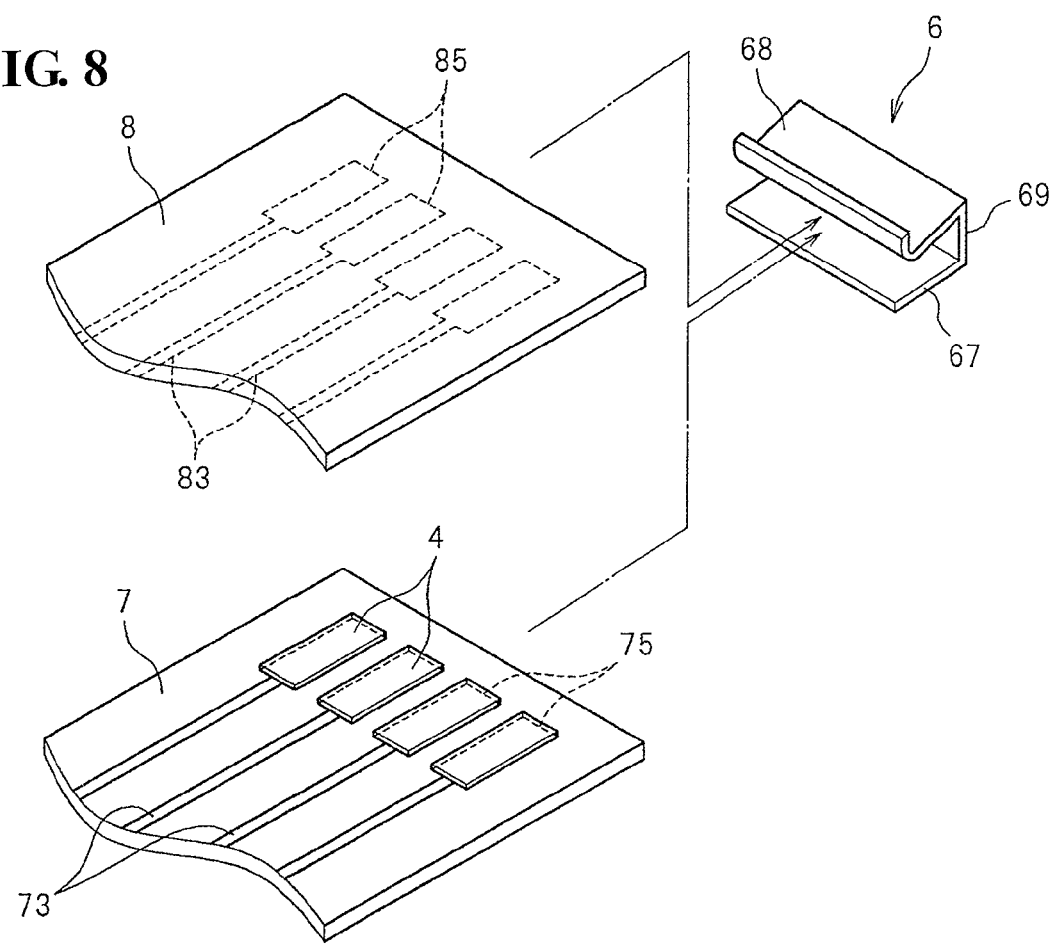
FIG. 8 is an exploded perspective view of another embodiment of a connector of the Present Application.
Figure 9:
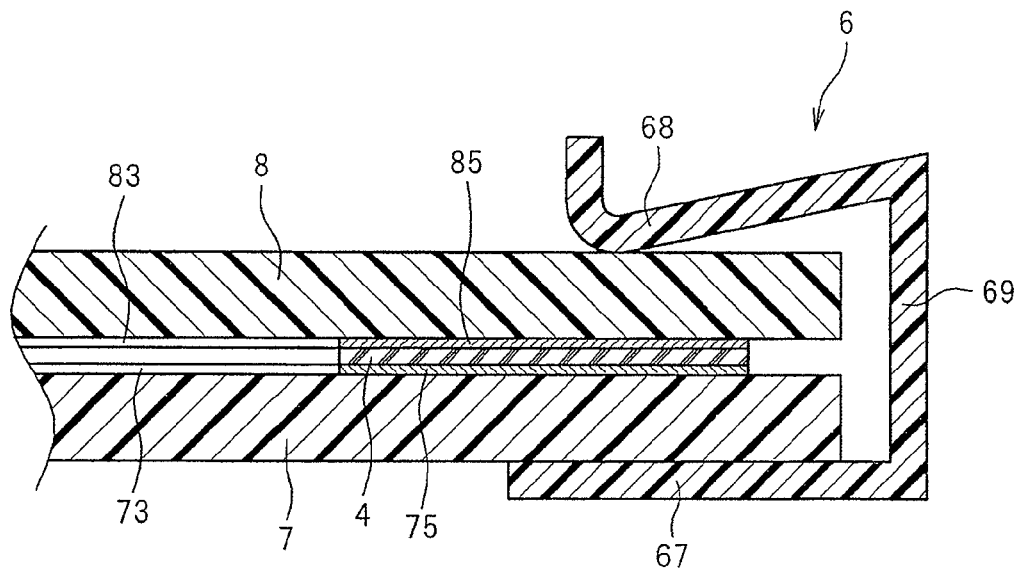
FIG. 9 is a sectional view of the connector of FIG. 8, illustrating how the circuit substrates are mated together.

FIGS. 8 and 9 are an exploded perspective view and a sectional view which illustrate another embodiment of the Present Application. Components which are the same as those in the above-mentioned embodiment are indicated by the same reference symbols and the detailed description thereof is omitted.

In this embodiment, the contact pads 75 which are formed on the first circuit substrate 7 serve as the first conductors or terminals, and the dielectric portions 4 are disposed on the contact pads 75. The contact pads 85 formed on the second circuit substrate 8 serve as the opposing, second conductors. The first and second circuit substrates 7, 8 are laminated in their construction and are pressed together against each other so that the dielectric portions 4 and contact pads 85 are brought into contact with each other, and are sandwiched between a substantially C-shaped clip 6 that fixes the two circuit substrates in place. At this time, the contact pads 75 and the contact pads 85 are opposed to each other with the dielectric portions 4 being interposed therebetween, whereby capacity-coupling is realized.

The clip 6 includes a supporting portion 67 coming into contact with the bottom surface of the first flat circuit substrate 7, an elastic deformation portion 68, which comes into contact with the bottom surface of the second flat circuit substrate 8, and presses by the elastic deformation the second flat circuit substrate 8 to the side of the first flat circuit substrate 7, and a coupling portion 69 for coupling the supporting portion 67 and the elastic deformation portion 68.

The liquid dielectric material 45 is applied to at least one of the dielectric portions 4 and the contact pads 85. Therefore, in the minute gaps formed between the dielectric portions 4 and the contact pads 85, the liquid dielectric material 45 is interposed in the manner as illustrated in FIG. 6. As a result, deterioration of capacitance between the contact pads 75 and 85 is suppressed.

Further, use of the liquid dielectric material 45 enables contact between the dielectric portions 4 and the contact pads 85, and filling of the minute gaps between the dielectric portions 4 and the contact pads 85. Further, with use of the liquid dielectric material 45, short circuit between the contact pads 85 is reduced even when a plurality of contact pads 85 are arranged in a horizontal plane.

Further, by sandwiching the dielectric portions 4 between the contact pads 75 and 85 without intermediation of the above-mentioned terminals 25, 35, the (vertical) distance between the first and the second circuit substrates 7, 8 is reduced.

While a preferred embodiment of the Present Application is shown and described, it is envisioned that those skilled in the art may devise various modifications without departing from the spirit and scope of the foregoing Description and the appended Claims.

What is claimed is:

1. A connector assembly, the connector assembly comprising:
    a first circuit substrate, the first circuit substrate including a plurality of first conductors associated therewith and a first connector mounted thereto, each first conductor connected to an electrical circuit of the first circuit substrate, the first connector including a first connector body that supports the first conductors;
    a second circuit substrate, the second substrate including a plurality of second conductors associated therewith and a second connector mounted thereto, each second conductor connected to an electrical circuit of the second circuit substrate, each of the first conductors opposing one of the second conductors, forming a conductor pair, the second connector including a second connector body that supports the second conductors; and
    a first dielectric portion, the first dielectric portion comprising a plurality of first dielectric portion, each first dielectric portion interposed between one of the conductor pairs; and
    a second dielectric portion, the second dielectric portion being a liquid dielectric material interposed between each first dielectric portion and one of the first and second conductors, the liquid dielectric material filling in minute gaps between each first dielectric portion and either of the first and second conductors;
    wherein the second connector body is bonded to the second circuit substrate at only two parallel points thereof, allowing for elastic deformation of the second connector body.

2. The connector assembly of claim 1, wherein the first conductor has a plate-like shape with two opposing contact surfaces disposed thereon, one contact surface being connected to the first circuit substrate electrical circuit, and one of the first dielectric portions is disposed on the other contact surface.

3. The connector assembly of claim 1, wherein the second conductor has a plate-like shape with two opposing contact surfaces, one contact surface being connected to the second circuit substrate electrical circuit, and one of the first dielectric portions is disposed on the other contact surface.

4. The connector assembly of claim 1, wherein the liquid dielectric material is selected from the group consisting of polypropylene glycol, silicone oil, petroleum jelly and acrylic resin.

5. The connector assembly of claim 1, wherein the liquid dielectric material has a viscosity between about 200 and 500 mPa·s (200 to 500centipoise) at 25° C.

6. The connector assembly of claim 1, wherein the liquid dielectric material is a glycol-based resin having a viscosity between about 200mPa·s and 500 mPa·s (200 to 500 centipoise) at 25° C.

7. The connector assembly of claim 1, wherein the liquid dielectric material has dielectric constant of between about 5 and 15.

8. The connector assembly of claim 1, wherein each first conductor is in the form of a contact pad disposed on the first circuit substrate, and each second conductor is in the form of a contact pad disposed on the second circuit substrate.

9. The connector assembly of claim 8, further including a clamp member that presses the first and second circuit substrates against each other.

10. The connector assembly of claim 1, wherein the second dielectric portion is applied to the first conductor.

11. The connector assembly of claim 1, wherein the second dielectric portion is applied to the second conductor.

12. A connector, comprising:
a body portion, a plurality of first conductors supported by the body portion, each first conductor including a contact surface;
a plurality of first dielectric portions, each first dielectric portion being disposed on one of the first conductor contact surfaces; and
a second dielectric material, the second dielectric material being liquid and disposed on each first dielectric portion, such that when the connector is mated to an opposing connector and the first conductors oppose complimentary second conductors of the opposing connector, the second dielectric material fills in minute gaps between each first dielectric portion and the opposing second conductors of the opposing connector, reducing the occurrence of air gaps therebetween, the opposing connector including an opposing second body portion, each opposing second conductor being supported by the opposing body portion;
wherein the second body portion is bonded to a circuit substrate at only two parallel points thereof, allowing for elastic deformation of the second body portion.

13. The connector of claim 12, wherein the second, liquid dielectric material is selected from the group consisting of polypropylene glycol, silicone oil, petroleum jelly and acrylic resin.

14. The connector of claim 12, wherein the second, liquid dielectric material has a viscosity between about 200 and 500 mPa·s (200 to 500 centipoise) at 25° C.

15. The connector of claim 12, wherein the each first conductor has a plate-like shape with two opposing contact surfaces disposed thereon, one contact surface being connected to a first electrical circuit, and one of the first dielectric portions is disposed on the other contact surface.

16. The connector of claim 12, wherein the second conductor has a plate-like shape with two opposing contact surfaces, one contact surface being connected to a second electrical circuit, and one of the first dielectric portions is disposed on the other contact surface.

17. The connector of claim 12, wherein the liquid dielectric material is a glycol-based resin having a viscosity between about 200 mPa·s and 500 mPa·s (200 to 500 centipoise) at 25° C.

18. The connector of claim 12, wherein the liquid dielectric material has dielectric constant of between about 5 and 15.

19. The connector of claim 12, further including a clamp member that presses the connector and the opposing connector together.

20. The connector of claim 12, wherein the second dielectric portion is applied to the first conductor.

21. The connector of claim 12, wherein the second dielectric portion is applied to the second conductor.

* * * * *